United States Patent
Sheng et al.

(10) Patent No.: US 9,035,272 B2
(45) Date of Patent: May 19, 2015

(54) NANOPARTICLE-BASED MEMRISTOR STRUCTURE

(71) Applicant: Hewlett-Packard Development Company, L.P., Houston, TX (US)

(72) Inventors: Xia Sheng, Palo Alto, CA (US); Zhang-Lin Zhou, Palo Alto, CA (US); Richard H. Henze, San Carlos, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/742,939

(22) Filed: Jan. 16, 2013

(65) Prior Publication Data

US 2014/0197369 A1 Jul. 17, 2014

(51) Int. Cl.
*H01L 29/02* (2006.01)
*H01L 45/00* (2006.01)
*B82Y 10/00* (2011.01)

(52) U.S. Cl.
CPC ............. *H01L 45/1608* (2013.01); *B82Y 10/00* (2013.01); *Y10S 977/83* (2013.01); *H01L 45/08* (2013.01); *H01L 45/1233* (2013.01); *H01L 45/1246* (2013.01); *H01L 45/146* (2013.01)

(58) Field of Classification Search
CPC ......... H01L 45/04; H01L 45/06; H01L 45/14; H01L 45/141; H01L 45/1608
USPC ........................................ 257/1, 2, 5, E45.001
See application file for complete search history.

(56) References Cited

U.S. PATENT DOCUMENTS

| | | | |
|---|---|---|---|
| 6,580,026 B1 * | 6/2003 | Koyanagi et al. | 136/263 |
| 7,348,653 B2 | 3/2008 | Cho et al. | |
| 7,405,167 B2 | 7/2008 | Kang et al. | |
| 7,932,507 B2 | 4/2011 | Chen et al. | |
| 8,143,703 B2 | 3/2012 | Heald et al. | |
| 2008/0185578 A1 | 8/2008 | Yoshizumi et al. | |
| 2011/0309321 A1 * | 12/2011 | Yang et al. | 257/5 |
| 2012/0074378 A1 * | 3/2012 | Wu et al. | 257/5 |
| 2012/0112167 A1 * | 5/2012 | Ribeiro et al. | 257/30 |
| 2012/0132108 A1 * | 5/2012 | Ishihara et al. | 106/287.1 |
| 2012/0314270 A1 * | 12/2012 | Cho | 359/230 |

* cited by examiner

*Primary Examiner* — Tan N Tran
(74) *Attorney, Agent, or Firm* — Hewlett-Packard Patent Department

(57) ABSTRACT

A memristor structure has two electrodes sandwiching an insulating region, and includes a nanoparticle providing a conducting path between the two electrodes, wherein either the insulating region comprises an inorganic material and nanoparticle comprises a solid nanoparticle or a core/shell nanoparticle or the insulating region comprises an inorganic or organic material and the nanoparticle comprises a core/shell nanoparticle.

18 Claims, 3 Drawing Sheets

NANOPARTICLE-BASED MEMRISTOR STRUCTURE

BACKGROUND

Memristors are devices that can be programmed to different resistive states by applying a programming energy, for example, a voltage or current pulse. This energy generates a combination of electric field and thermal effects that can modulate the conductivity of both non-volatile switch and non-linear select functions in a memristive element. After programming, the state of the memristor can be read and remains stable over a specified time period. Memristive elements can be used in a variety of applications, including non-volatile solid state memory, programmable logic, signal processing, control systems, pattern recognition, and other applications.

DETAILED DESCRIPTION

Figure 1:
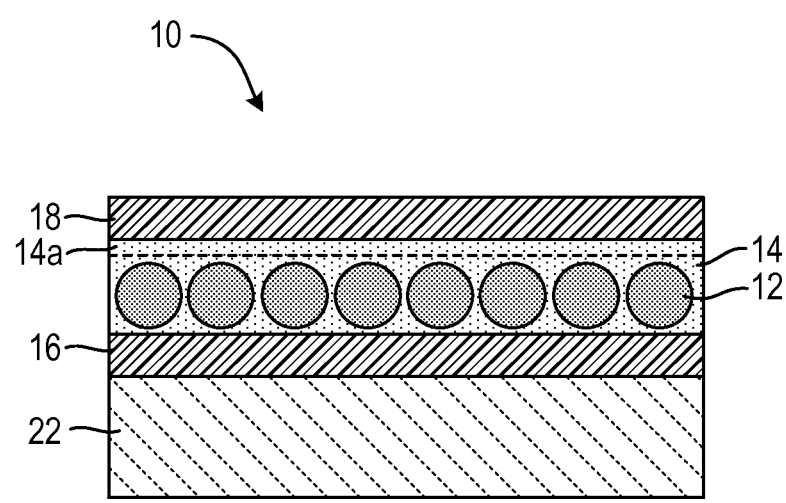
FIG. 1 depicts the structure of a memristor device with nanoparticles embedded in insulating material, according to an example.

Reference is made now in detail to specific examples, which illustrates the best mode presently contemplated by the inventors for practicing the invention. Alternative examples are also briefly described as applicable.

As used in the specification and claims herein, the singular forms "a," "an," and "the" include plural referents unless the context clearly dictates otherwise.

As used in this specification and the appended claims, "approximately" and "about" mean a ±10% variance caused by, for example, variations in manufacturing processes.

In the following detailed description, reference is made to the drawings accompanying this disclosure, which illustrate specific examples in which this disclosure may be practiced. The components of the examples can be positioned in a number of different orientations and any directional terminology used in relation to the orientation of the components is used for purposes of illustration and is in no way limiting. Directional terminology includes words such as "top," "bottom," "front," "back," "leading," "trailing," etc.

It is to be understood that other examples in which this disclosure may be practiced exist, and structural or logical changes may be made without departing from the scope of the present disclosure. Therefore, the following detailed description is not to be taken in a limiting sense. Instead, the scope of the present disclosure is defined by the appended claims.

Memristors are nano-scale devices that may be used as a component in a wide range of electronic circuits, such as memories, switches, and logic circuits and systems. In a memory structure, a crossbar of memristors may be used. For example, when used as a basis for memories, the memristor may be used to store a bit of information, 1 or 0, corresponding to whether the memristor is in its high or low resistance state (or vice versa). When used as a logic circuit, the memristor may be employed as configuration bits and switches in a logic circuit that resembles a Field Programmable Gate Array, or may be the basis for a wired-logic Programmable Logic Array. It is also possible to use memristors capable of multi-state or analog behavior for these and other applications.

When used as a switch, the memristor may either be in a low resistance (closed) or high resistance (open) state in a cross-point memory. During the last few years, researchers have made great progress in finding ways to make the switching function of these memristors behave efficiently. For example, tantalum oxide ($TaO_x$)-based memristors have been demonstrated to have superior endurance over other nano-scale devices capable of electronic switching. In lab settings, tantalum oxide-based memristors are capable of over 10 billion switching cycles.

A memristor may comprise a switching material, such as $TiO_x$ or $TaO_x$, sandwiched between two electrodes. Memristive behavior is achieved by the movement of ionic species (e.g. oxygen ions or vacancies) within the switching material to create localized changes in conductivity via modulation of a conductive filament between two electrodes, which results in a low resistance "ON" state, a high resistance "OFF" state, or intermediate states. Initially, when the memristor is first fabricated, the entire switching material may be nonconductive. As such, a forming process may be required to form the conductive channel in the switching material between the two electrodes. A known forming process, often called "electroforming", includes applying a sufficiently high (threshold) voltage across the electrodes for a sufficient length of time to cause a nucleation and formation of a localized conductive channel (or active region) in the switching material. The threshold voltage and the length of time required for the forming process may depend upon the type of material used for the switching material, the first electrode, and the second electrode, and the device geometry.

More particularly, electroforming is a process that initially establishes a conducting channel by applying a relative high voltage to a virgin device, causing a localized change that defines the region for subsequent switching modulation. However, devices that require electroforming may have some drawbacks: (a) electroforming may partially damage the device in a way that limits endurance; (b) a random nature may cause significant increase in switching variance of a device or across a population of devices; (c) high voltage may be required; and (d) it may be difficult to implement. Therefore, elimination of the electroforming process or reducing it to conditions very close to normal ON and OFF switching conditions may be desired. $TaO_x$-based switching materials have demonstrated excellent stability and $10^{15}$ switching cycles. By reducing the thickness of the switching layer, low voltage electroforming may be possible, but this process may not be very well-controlled.

Electroforming-free devices, defined as devices where an initial electroforming cycle may be very close to the normal operating conditions, may be desired, and effort has gone into developing such electroforming-free devices. The thickness for a forming-free device depends on many factors, such as device size, electrode surface roughness, the uniformity of the oxide films, etc. In general, a conventional forming-free device may have a reduced thickness of full insulating oxide (e.g. about 5 nm or less of $TiO_2$ or $Ta_2O_5$) compared to a non-forming free device, along with a relatively thick conductive suboxide (e.g., $TiO_x$, such as $Ti_4O_7$, or $TaO_x$) of about 10 to 20 nm. In these examples, x is some value sufficient to render the suboxide electrically conducting relative to the full oxide. For example, in the case of $TiO_x$, x has a value of about 1.75, while in the case of $TaO_x$, x has a value of less than about 2. Thus, the value of x varies, depending on the specific metal oxide. However, these values are known for oxides employed in memristor technology.

Metal or semiconductor oxides are commonly employed in memristor devices; examples include either transition metal oxides, such as tantalum oxide, titanium oxide, yttrium oxide, hafnium oxide, zirconium oxide, or other like oxides, or non-transition metal oxides, such as aluminum oxide, calcium oxide, magnesium oxide, dysprosium oxide, lanthanum oxide, silicon dioxide, or other like oxides. Because these oxides usually have native donors and also because they may need to be thin to electroforming-free, the resulting device may be too leaky, even in the OFF (high resistance) state. This results in a large switching current and smaller OFF/ON resistance ratio, which may be an impediment for incorporation into practical circuits for the commercialization of memristors. In some cases, electroforming-free behavior may be caused y defects or surface roughness of the electrodes, which may be hard to control. The same may hold true for the corresponding nitrides and carbides.

In accordance with the teachings herein, a nanoparticle-based switching layer is provided. Specifically, a memristor structure may comprise two electrodes sandwiching an inorganic insulating region, and may further include at least one nanoparticle that provides a conducting path between the two electrodes for improving electroforming and uniformity characteristics. Further, a memristor structure may comprise two electrodes sandwiching an insulating region, and may further include at least one core/shell nanoparticle that provides a conducting path between the two electrodes for improving electroforming and uniformity characteristics.

In the case of an inorganic insulating region, the nanoparticles may be single composition particles that contain conducting or semiconducting material as part of the switching material. These materials may include metals, semiconductor quantum dots, metal suboxides, metal subnitrides, metal-doped oxides or nitrides, etc. Examples include, but are not limited to, Si, Pt, Ta, Ti, Cu, Al, $TiO_x$, $TaO_x$, $ZnO_x$, ZnS, TaN, and TiN. Alternatively, the nanoparticles may have a core/shell structure, with a conductive core and a less conductive shell. Core materials may include metals, semiconductor, metal suboxides, metal subnitrides, metal-doped oxides or nitrides, etc. Examples of the core materials include, but are not limited to, Si, Pt, Ta, Ti, Cu, Al, $TiO_x$, $TaO_x$, $ZnO_x$, ZnS, TaN, and TiN. Examples of shell materials may include full oxides (e.g., $TiO_2$, $Ta_2O_5$, and $SiO_2$), suboxides (e.g., $TiO_x$, $TaO_x$, and $SiO_x$), nitrides (e.g., $Si_3N_4$ and AlN), and carbides (e.g., SiC).

In the case of an insulating region, which may be inorganic or organic, the nanoparticles may have the core/shell structure described above.

To fabricate a device, the nanoparticles may be embedded in the insulating material. The insulating material may be planarized prior to fabricating a top electrode. The nanoparticles may behave as oxygen vacancy reservoirs. Because the thickness of the oxide/insulator where there are nanoparticles in between the top and electrodes is smaller than that in between nanoparticles, the electric field in these regions is higher. The E-field is further enhanced by the small radius of the nanoparticle. Since memristor switching is an E-field-driven process, the switching may prefer to happen in these pre-defined spots. The switching device so based on nanoparticles and/or core/shell nanoparticles may be electroforming-free or require reduced electroforming energies, based on the belief that the conducting nanoparticles define the preferential conducting path for the device due to E-field enhancement.

In the formation of memristors according to the teachings herein, bottom electrodes may be patterned on an insulating substrate. Nanoparticles with insulating media may be assembled on top of the bottom electrode, and a top electrode may then be patterned to form a cross-bar structure. The nanoparticles may be single layer or multilayer. In some examples, such as in cross-bar structures, the thickness of the layer containing nanoparticles may not be greater than the lateral dimension between electrodes as well as the gap between the electrodes to isolate adjacent bits.

The nanoparticles may be chemically synthesized according to methods known in the literature, and dispersed in a solvent as a colloid to aid in assembly onto a substrate to form a solid state device (memristor). Examples of solvents include, but are not limited to, water, methanol, ethanol, isopropanol, butanol, hexafluoro-isopropanol, toluene, MIBK, chlorobenzene, chloroform, and xylenes and mixtures thereof. In other examples, a solution may be formed of a monomer, such as methyl methacrylate, an oligomer, or polymer, such as polymethyl methacrylate, plus a solvent, such as one or more of those listed above. In such other examples, the nanoparticles may be dispersed in the solution.

In some examples, nanoparticles with a core/shell structure may be used. Such core/shell nanoparticles may be synthesized, for example, by a one-step liquid phase laser ablation of a metal plate in an alcohol-based solvent, such as ethanol. Rapid reactive quenching of ablated species at the interface between the laser-induced plasma plume and molecules in a liquid phase produces the core/shell nanoparticles.

The nanoparticles may also be synthesized by a microemulsion method. The microemulsion may be prepared by adding a sodium hydroxide-water solution to an oil phase composed of surfactant, alcohol, and hydrocarbon. To the above microemulsion may be added metal alkoxides, with the desired metal suboxide nanoparticles formed in about 5 to 10 min. The sizes of nanoparticles can be controlled by the amount of alcohol.

FIG. 1 shows a structure of a single memristor device 10 with nanoparticles 12 embedded in an insulating material 14. The nanoparticles 12 may be in contact with at least the bottom electrode 16, and the insulating material 14 may be in contact with the top electrode 18. In some examples, the nanoparticles 12 may be in contact with both electrodes 16, 18. In other cases, a resistive layer 14a may be situated between the nanoparticles 12 and the top electrode 18 as the switching layer. The resistive layer 14a may or may not be the same material as the resistive layer 14. Conversely, the nanoparticles 12 may be in contact with the top electrode 18, and the resistive layer may be in contact with the bottom electrode 16. In any event, the insulating material 14 may fill in the spaces between the nanoparticles 12 and may even be the resistive layer in some examples.

The insulating material 14 may be an insulating oxide, an insulating nitride, or an insulating carbide, such as $TiO_2$, $Ta_2O_5$, $SiO_2$, $Si_3N_4$, SiC, or $Al_2O_3$. Materials for layer 14a may include full or suboxide, nitride, and carbide, such as $TiO_2$, $Ta_2O_5$, $SiO_2$, $TiO_x$, $TaO_x$, and SiC. For example, the nanoparticle 12 may be Ta, the layer 14a may be $TaO_x$, and the layer 14 may be $Ta_2O_5$.

Because the thickness of the insulating material 14 on top of the nanoparticles 12 may be less than that in between the nanoparticles, switching may occur at the interface of the nanoparticle and the insulating material. It will be appreciated that FIG. 1 (as well as FIG. 2B) are not to scale with regard to the dimensions of the various elements of the device. The diameter of the nanoparticles 12 may be about 1 to 50 nm in some examples and from about 2 to 8 nm in other examples.

In this connection, the diameter of the nanoparticles in colloidal suspension may be measured by dynamic light scattering (DLS), while the diameter of the nanoparticles on a substrate may be measured by scanning electron microscopy (SEM) or transmission electron microscopy (TEM). Also, it may be appreciated that only one nanoparticle 12 may be necessary to provide switching, even though a plurality of nanoparticles is depicted in the drawings.

As an example, Ta nanoparticles 12 may be assembled on the bottom electrode 16. The insulating layer may be $Ta_2O_5$ 14, which may be filled in between and on top of the Ta nanoparticles 12 by an atomic layer deposition process. Planarization or self-planarization may be employed, as described more fully below.

Figure 2A:
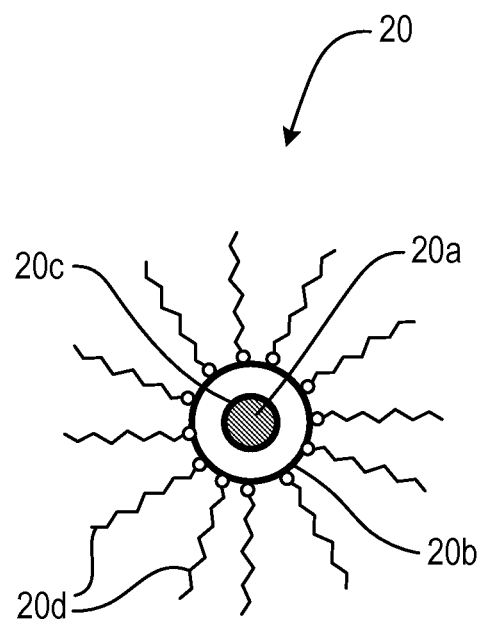
FIG. 2A depicts a structure of a core/shell nanoparticle with ligands, according to an example.
Figure 2B:
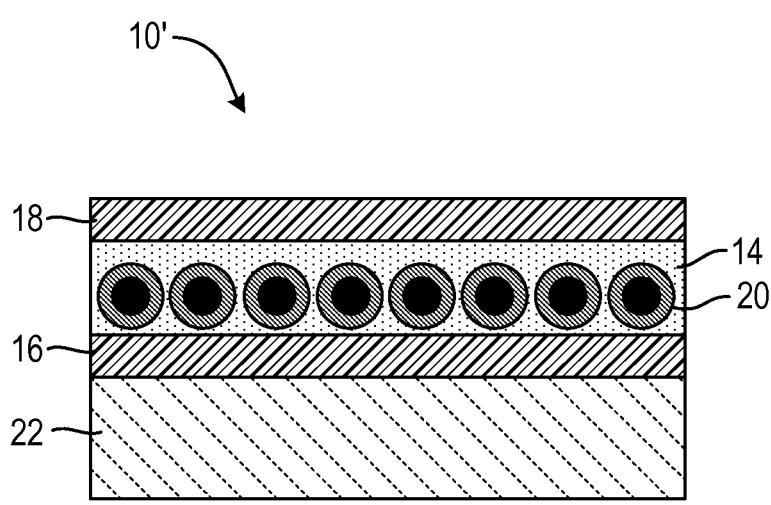
FIG. 2B depicts a memristor device with core/shell nanoparticles, according to an example.

FIG. 2A shows a structure of a nanoparticle 20 having a core/shell structure comprising a core 20a and a shell 20b. FIG. 2B depicts a device 10' with the core/shell nanoparticles 20. The thickness of the core 20a may range from about 1 to 50 nm and the thickness of the shell 20b may range from about 1 to 5 nm. As an example, one or more $Ta/Ta_2O_5$ core/shell nanoparticles 20 having a core 20a of Ta and a shell 20b of $Ta_2O_5$ may be assembled on the bottom electrode 16. An insulating layer 14 of $Al_2O_3$ may be filled in between and on top of the nanoparticles 20, such as by an atomic layer deposition process. Other examples of core/shell particles 20 include a core 20a of amorphous Si or a metal-doped oxide, nitride, or carbide with a shell 20a of a more resistive material (at least 5× more resistive). For example, the core 20a may be silicon and the shell may be silicon dioxide, in which the conductivity of the silicon core is adjusted by, for example, appropriate doping to be at least 5 times more conductive than the silicon dioxide shell 20b. As with the nanoparticles 12, it may be appreciated that only one core/shell nanoparticle 20 may be necessary to provide switching, even though a plurality of nanoparticles is depicted in the drawings.

In FIG. 2B, the resistive layer 14a may not be needed, since the shell 20b of the core/shell particles 20 provides the resistance function.

In some examples, the nanoparticles may have a narrow size distribution, such as a FWHM of <10%. The particle size distribution to determine FWHM can be measured by dynamic light scattering methods, for example.

In both instances (nanoparticles 12 and core/shell nanoparticles 20), the thickness of the insulation material 14 may range from the minimum thickness sufficient to fill all gaps of the nanoparticles (or the thickness of the nanoparticle 12, 20) to 1 to 3 nanometers more than the maximum thickness of the nanoparticle(s) 12, 20, to provide flattening for the deposition of the top electrode 18. In some cases, a planarization process may be employed.

In both instances, additional layers (not shown), such as another oxide or suboxide layer, or doped oxide or doped nitride, or semiconductor such as amorphous Si, may be included to improve the device performance, e.g., non-linearity. Such layer(s) may be placed between the resistive layer 14a and the top electrode 18, as in the case of the solid nanoparticles shown in FIG. 1, or between the core/shell nanoparticle(s) 20 and the top electrode 18 shown in FIG. 2B.

It has been noted that only one nanoparticle 12, 20 may be present. This is based on the belief that the ON state will find the path of least resistance, and in some cases, that path may be a single nanoparticle 12, 20.

In other examples, the core 20a may be a metal or metal suboxide (or a metal subnitride or a metal subcarbide) that conducts electrons (or ions or vacancies such as oxygen vacancies, nitrogen vacancies, or carbon vacancies). The shell 20b may be an insulating metal oxide (or an insulating metal nitride or an insulating metal carbide) that is comparatively lower in conductivity. The switching may occur at the interface 20c of the nanoparticle core 20a and shell 20b. Ligands 20d that may be either hydrophilic or hydrophobic may be provided to make the core/shell nanoparticles 20 dispersible in either aqueous media (hydrophilic) or organic solvents (hydrophobic) such as toluene, chloroform, etc. Examples of hydrophilic ligands include, but are not limited to, polyethylene glycol (PEG), polyamines, sulfonates and carboxylates of trichlorosilane and trialkoxysilane, thiols, carboxylic acids, and amines. Examples of hydrophilic ligands include, but are not limited to, long chain alkylamines such as octadecylamine, long chain alkyltrichlorosilanes, long chain alkyltrimethoysilanes, long chain alkyltriethoxysilanes, long chain alkylthiols and long chain alkylcarboxylic acids such as octanamine, nonanamine, decaneamine, undecaneamine, dodecanamine, tridecanamine, tetradecanamine, hexadecaneamine, eicosanamine. By "long chain" is meant alkyl chains having from about 8 to 20 carbon atoms. The length of the chain may control the distance between nanoparticles (if more than one is present) and/or between nanoparticles and the electrode(s). Ligands 20d may act as built-in resistors to provide non-linearity of the memristors.

The shell 20b of the nanoparticles 20 may be a thin metal oxide layer that has free —OH groups. These —OH groups can bind to functional groups such as thiol, amine, carboxylate, etc., via hydrogen bonding, or react with trichlorosilanes or trialkoxysilanes to form an O—Si covalent bond. These are examples of ways in which the ligands 20d may be attached to the shell 20b.

Figure 3:
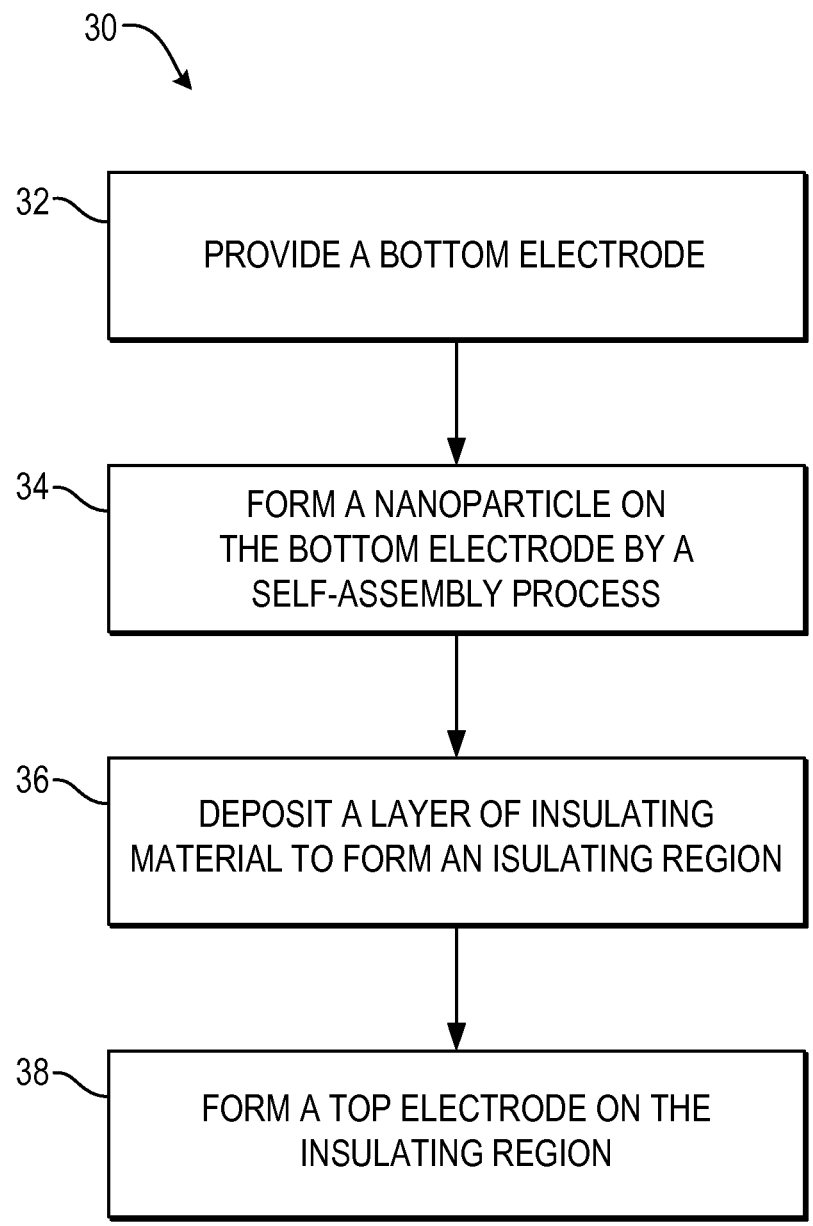
FIG. 3 is a flow chart depicting a method for making a memristor with nanoparticles, according to an example.

A method 30 for fabricating memristors is depicted in FIG. 3. In the memristors 10, 10', the bottom electrode 16 and the top electrode 18 sandwich the insulating region 14. The memristors 10, 10' further include nanoparticles 12, 20 providing a pre-defined conducting path between the bottom electrode 16 and the top electrode 18. The method 30 includes providing 32 the bottom electrode 16. The bottom electrode may be formed on the substrate 22. The method 30 further includes forming 34 a nanoparticle 12, 20 on the bottom electrode 16 by a self-assembly process. The nanoparticle 12, 20 may be a single nanoparticle or a layer of nanoparticles. The method 30 additionally includes depositing 36 a layer of insulating material to form the insulating region 14. The method also includes forming 38 the top electrode 18 on the insulating region 14. More specific description is provided below.

Deposition of Bottom Electrode 16

The bottom electrode 16 may be provided 32 on the substrate 22 by any of the conventional processes, including electroplating, sputtering, evaporation, ALD (atomic layer deposition), co-deposition, chemical vapor deposition, IBAD (ion beam assisted deposition), or any other film deposition technology. Examples of bottom electrode 16 materials include, but are not limited to, aluminum (Al), copper (Cu), platinum (Pt), tungsten (W), gold (Au), titanium (Ti), silver (Ag), ruthenium dioxide ($RuO_2$), titanium nitride (TiN), tungsten nitride ($WN_2$), tantalum (Ta), tantalum nitride (TaN) or the like. As another particular example, both the first electrode 16 and the second electrode 18 may be formed of doped silicon (Si). The electrodes 16 may be patterned, if desired. The thickness of the first electrode 16 may be in the range of about 10 nm to a few micrometers.

Synthesis of Nanoparticles 12, 20

Nanoparticles 12 with $TaO_x$ with x<2 or nanoparticles 20 with a $Ta/Ta_2O_5$ core/shell, each with a particle size of 5 to 10 nm may be synthesized according to known procedures and dispersed in common solvents, such as water, methanol, methyl isobutyl ketone (MIBK), chloroform, toluene, or xylenes, to form a colloid. The nanoparticles 20 may also contain ligands 20d to help the nanoparticles to be uniformly dispersed into the common solvents. The functions of ligands 20d on the surface of nanoparticle 20 may include: (a) the ligands may help dispersion of the nanoparticles in common solvents; (b) the ligands may keep the nanoparticles electrically separated in the layer; (c) the ligands are highly resistive, so they may limit the leakage current and provide non-linearity of the I-V property of the memristor; and (d) the ligands may provide a self-planarization process for insulating material deposition, as described more fully below.

Assembly of Nanoparticles

Single or multi-layer nanoparticles 12, 20 may be assembled for formed 34 on patterned bottom electrodes 16 by any self-assembly process, such as spin coating, dipcoating, Langmuir-Blodgett deposition, and the like. Some surface treatment may be employed to improve the adhesion and film quality. Any of the available surface treatments may be employed, such as oxygen plasma treatment or monolayer molecule treatment.

Deposition of Insulator

The insulating material 14 may be deposited 36 in one of two ways: together with the nanoparticles 12, 20, or separately. In the first case, blocks 34 and 36 may be combined. In this case, the colloid that contains the nanoparticles 12, 20 also contains dissolved insulation material or one or more precursors of the insulating material. For example, the colloidal solution may contain nanoparticles with ligands, polymethylmethacrylate (PMMA) polymer, and solvent, such as toluene. As another example, the colloidal solution may contain nanoparticles and a siloxane polymer, which may be cured by UV or heating after the deposition.

In the second case, the nanoparticles 12, 20 may be deposited 34 first, followed by deposition 36 of the insulating material, such as $Ta_2O_5$ or $Al_2O_3$. Conventional deposition methods include e-beam deposition, sputter deposition, atomic layer deposition (ALD), and the like. In some cases, planarization, such as chemical mechanical polishing (CMP), may be needed to flatten the surface of the bottom electrode 16, while in other cases, a self-planarization may be performed during the deposition. One example of self-planarization may be to use nanoparticles 20 that are surrounded by hydrophobic ligands 20d, such as octadecylamine, followed by an atomic layer deposition of the insulating material, such as $Ta_2O_5$ or $Al_2O_3$. Because of the hydrophobic properties of the ligands, the ALD process may selectively fill the interstices among the nanoparticles first, forming a flattened surface, and then uniformly grow the film.

Deposition of Top Electrode 18

The top electrode 18 may be provided 38 on the insulating layer 14 by any of the conventional processes listed above for the bottom electrode 16. Examples of top electrode 18 materials include, but are not limited to, the same as those listed above for the bottom electrode 16. The top electrode 18 material may or may not be the same as the bottom electrode 16 material. The thickness of the top electrode 18 may be in the range of about 10 nm to a few micrometers.

The advantages of the foregoing teachings may include (a) the ability to provide an electro-forming free memristor; (b) a solution process may be employed to form a portion of the memristor; (c) built-in non-linearity may be obtained; and (d) the material is not conductive laterally, so patterning of the switching material may not be needed.

What is claimed is:

1. A memristor structure comprising two electrodes sandwiching an insulating region, and including a nanoparticle providing a conducting path between the two electrodes, wherein the insulating region comprises an inorganic or organic material and the nanoparticle comprises a core/shell nanoparticle that has a conductive core and a less conductive shell, wherein the memristor structure is a solid state device.

2. The memristor of claim 1 wherein the two electrodes are independently selected from the group consisting of aluminum, copper, platinum, tungsten, gold, titanium, silver, ruthenium dioxide, titanium nitride, tungsten nitride, tantalum, and tantalum nitride.

3. The memristors of claim 1 wherein the insulating region comprises an oxide.

4. The memristors of claim 3 wherein the insulating region comprises an oxide selected from the group consisting of tantalum oxide, titanium oxide, yttrium oxide, hafnium oxide, zirconium oxide, aluminum oxide, calcium oxide, and magnesium oxide, dysprosium oxide, lanthanum oxide, and silicon dioxide.

5. The memristors of claim 1 wherein the nanoparticle is adjacent or touching one or the other of the two electrodes.

6. The memristors of claim 5 wherein the insulating region has a thickness that ranges from a diameter of the nanoparticle to up to 10 nm thicker than the diameter of the nanoparticle.

7. The memristors of claim 6 wherein the nanoparticle has diameter within a range of about 1 to 50 nm.

8. The memristors of claim 1 wherein the core comprises metal or metal sub-oxide, sub-nitride or sub-carbide that conducts electrons, ions or vacancies and the shell comprises an insulating oxide, suboxide, nitride or carbide that is comparatively lower in conductivity.

9. The memristors of claim 1 wherein the core/shell structure further includes ligands attached to the shell.

10. The memristors of claim 9 wherein the ligands are either hydrophilic or hydrophobic.

11. The memristors of claim 10 wherein the ligands are hydrophilic and are selected from the group consisting of polyethyleneglycol (PEG), polyamines, sulfonates and carboxylates of trichlorosilane and trialkoxysilane, thiols, carboxylic acids, and amines.

12. The memristors of claim 10 wherein the ligands are hydrophobic and are selected from the group consisting of long chain alkylamines, long chain alkyltrichlorosilanes, long chain aikyltrimethoysilanes, long chain alkyltriethoxysilanes, long chain alkylthiols and long chain alkylcarboxylic acids such as octanamine, nonanamine, decaneamine, undecaneamine, dodecanamine, tridecanamine, tetradecanamine, hexadecaneamine, and eicosanamine.

13. The memristors of claim 1 wherein the nanoparticle has a diameter within a range of about 2 to 100 nm.

14. A method for making solid state memristors that comprise a bottom electrode and a top electrode sandwiching an insulating region, and including a nanoparticle providing a conducting path between the bottom electrode and the top electrode, the insulating region comprising an inorganic or organic material and the nanoparticle comprising a core/shell nanoparticle that has a conductive core and a less conductive shell, the method including:

providing the bottom electrode;
forming the nanoparticle on the bottom electrode by a self-assembly process;
depositing a layer of insulating material to form the insulating region; and
forming the top electrode on the insulating region.

15. The method of claim 14 wherein the nanoparticle is deposited on the bottom electrode together with the layer of insulating material.

16. The method of claim 15 wherein the nanoparticle and insulating material are deposited from a colloid comprising the nanoparticle and the insulating material dispersed in a solvent.

17. The method of claim 16 wherein the solvent is selected from the group consisting of water, methanol, ethanol, isopropanol, butanol, hexafluoro-isopropanol, toluene, MIBK, chlorobenzene, chloroform, and xylenes and mixtures thereof.

18. The method of claim 14 wherein the layer of insulating material is deposited after forming the nanoparticle on the bottom electrode.

\* \* \* \* \*